United States Patent
Dyer

(10) Patent No.: US 7,741,693 B1
(45) Date of Patent: Jun. 22, 2010

(54) METHOD FOR INTEGRATING TRENCH MOS SCHOTTKY BARRIER DEVICES INTO INTEGRATED CIRCUITS AND RELATED SEMICONDUCTOR DEVICES

(75) Inventor: Terry Dyer, Ayrshire (GB)

(73) Assignee: National Semiconductor Corporation, Santa Clara, CA (US)

(*) Notice: Subject to any disclaimer, the term of this patent is extended or adjusted under 35 U.S.C. 154(b) by 205 days.

(21) Appl. No.: 11/985,628

(22) Filed: Nov. 16, 2007

(51) Int. Cl.
H01L 29/47 (2006.01)

(52) U.S. Cl. .................. 257/484; 257/471; 257/483; 438/167; 438/576

(58) Field of Classification Search ............... 257/197, 257/256, 328, 330, 335, 365, 417, 471, 476, 257/484, 260; 438/424, 527, 92
See application file for complete search history.

(56) References Cited

U.S. PATENT DOCUMENTS

| 5,365,102 | A | 11/1994 | Mehrotra et al. | |
| 6,078,090 | A * | 6/2000 | Williams et al. | 257/476 |
| 6,351,018 | B1 | 2/2002 | Sapp | |
| 6,404,033 | B1 * | 6/2002 | Chang et al. | 257/484 |
| 6,433,396 | B1 | 8/2002 | Kinzer | |
| 6,593,620 | B1 * | 7/2003 | Hshieh et al. | 257/335 |
| 6,710,418 | B1 * | 3/2004 | Sapp | 257/471 |
| 6,770,548 | B2 | 8/2004 | Hshieh et al. | |
| 6,855,593 | B2 | 2/2005 | Andoh et al. | |
| 6,987,305 | B2 | 1/2006 | He et al. | |
| 6,998,678 | B2 | 2/2006 | Werner et al. | |
| 7,067,879 | B1 | 6/2006 | Dyer et al. | |
| 7,518,208 | B2 * | 4/2009 | Shirai et al. | 257/471 |
| 2005/0199918 | A1 * | 9/2005 | Calafut et al. | 257/260 |
| 2005/0202637 | A1 * | 9/2005 | Chiola | 438/270 |
| 2006/0209887 | A1 * | 9/2006 | Bhalla et al. | 370/466 |

OTHER PUBLICATIONS

Syotara Ono, et al., "High density MOSBD (UMOS with built-in Trench Schottky Barrier Diode) for Asynchronous Buck Converters", IEEE 2006, Proceedings of the 18th Annual Symposium Power Semiconductor Devices and IC's, Jun. 4-8, 2006 Naples, Italy, pp. 1-4.*
Syotara Ono, et al., "High density MOSBD (UMOS with built-in Trench Schottky Barrier Diode) for Synchronous Buck Converters," IEEE 2006, Proceedings of the 18th International Symposium on Power Semiconductor Devices & IC's, Jun. 4-8, 2006 Naples, Italy, pp. 1-4.
Daniel Calafut, "Trench Power MOSFET Lowside Switch with Optimized Integrated Schottky Diode," Proceedings of 2004 International Symposium on Power Semiconductor Devices & ICs, Kitakyushu, pp. 397-400.

* cited by examiner

*Primary Examiner*—Thanh V Pham
*Assistant Examiner*—Errol Fernandes

(57) ABSTRACT

Trenches are formed in a semiconductor substrate, where the trenches include an outer trench and multiple inner trenches within the outer trench. A metal-oxide semiconductor (MOS) device and a trench MOS Schottky barrier (TMBS) device are also formed in the semiconductor substrate using the trenches. The MOS device could include the outer trench, and the TMBS device could include the inner trenches. At least one of the inner trenches may contact the outer trench, and/or at least one of the inner trenches may be electrically isolated from the outer trench. The MOS device could represent a trench vertical double-diffused metal-oxide semiconductor (VDMOS) device, and the TMBS device may be monolithically integrated with the trench VDMOS device in the semiconductor substrate. A guard ring that covers portions of the inner trenches and that is open over other portions of the inner trenches could optionally be formed in the semiconductor substrate.

20 Claims, 4 Drawing Sheets

METHOD FOR INTEGRATING TRENCH MOS SCHOTTKY BARRIER DEVICES INTO INTEGRATED CIRCUITS AND RELATED SEMICONDUCTOR DEVICES

TECHNICAL FIELD

This disclosure is generally directed to integrated circuits and more specifically to a method for integrating trench metal-oxide semiconductor ("MOS") Schottky barrier devices into integrated circuits and related semiconductor devices.

BACKGROUND

Power management devices are often used in discrete low-voltage applications. Conventional power management devices often include trench vertical double-diffused metal-oxide semiconductor ("VDMOS") devices. These trench VDMOS devices have recently been adapted to include trench MOS Schottky barrier ("TMBS") devices, which can be used to provide low forward voltage drops and increased switching speeds.

A TMBS device typically represents a synthesis of planar Schottky and trench technologies that produces a reduction in a surface electric field of the device (due to the "super-junction" effect). This effect reduces the electric field at the Schottky interface, lowering the leakage current and increasing the breakdown voltage of the TMBS device. This may be achieved by extending the depletion region for a given voltage into a semiconductor substrate, such as by merging two opposing depletion regions.

In conventional approaches, the TMBS devices are routinely fabricated as discrete devices normally included as an enhancement to discrete trench VDMOS devices, and multi-chip technology is used to connect the discrete device to a control integrated circuit. These types of multi-chip solutions often suffer from various problems, such as parasitic inductance. Also, Schottky devices often suffer from reverse leakage current, which is typically several orders of magnitude higher than the reverse leakage current for an equivalent area p-n junction. The barrier height of a metal layer in the Schottky devices typically plays a role in determining the amount of reduced voltage drop that can be traded off against increased leakage current. Typically, a metal layer with a lower barrier height may reduce forward voltage but may have higher leakage current. A metal layer with a higher barrier height may offer reduced leakage current but may have increased forward voltage. Increased leakage may also be due to sharp edges around the periphery of a metal plate that forms a contact for the Schottky device.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1A:
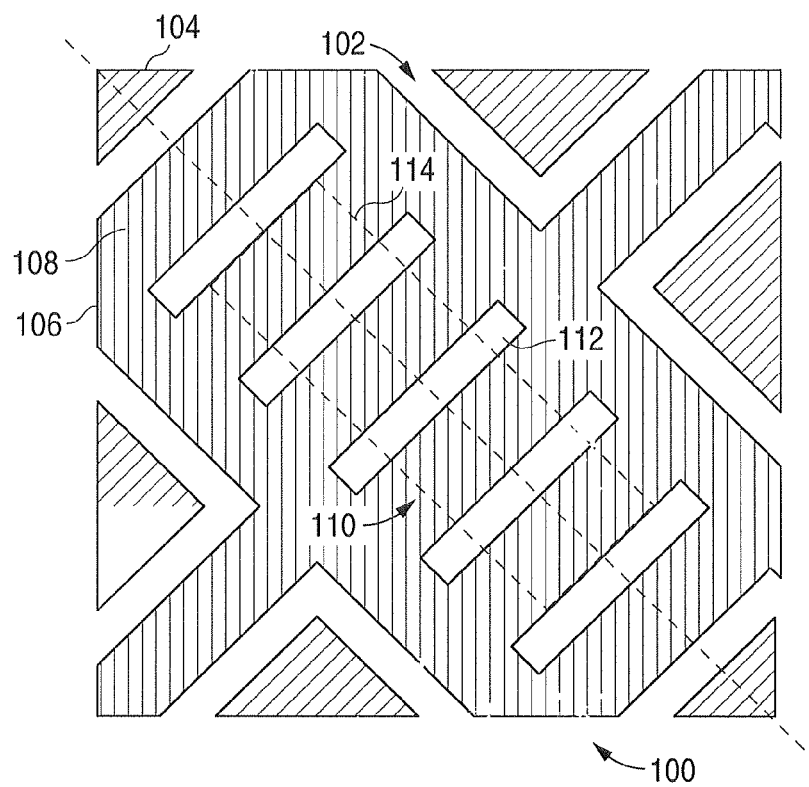
FIGS. 1A and 1B illustrate a first example integrated circuit containing a trench MOS Schottky barrier device according to this disclosure.
Figure 1B:
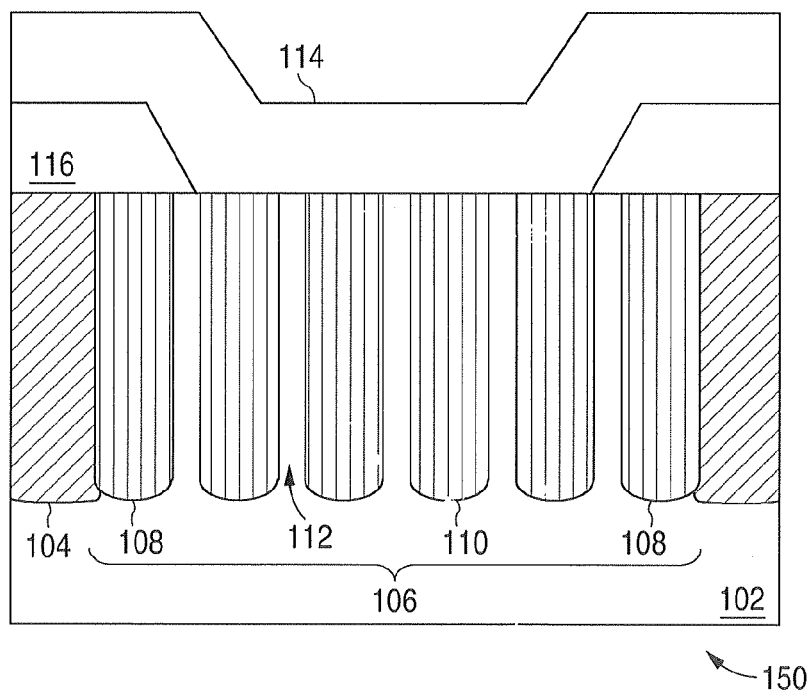

FIGS. 1A and 1B illustrate a first example integrated circuit 100 containing a trench MOS Schottky barrier device according to this disclosure. The embodiment of the integrated circuit 100 shown in FIGS. 1A and 1B is for illustration only. Other embodiments of the integrated circuit 100 may be used without departing from the scope of this disclosure.

In this example, FIG. 1A represents a plan or layout view of the integrated circuit 100, and FIG. 1B represents a cross-section 150 of the integrated circuit 100 taken along the main dashed line in FIG. 1A. As shown here, the integrated circuit 100 includes a substrate 102. The substrate 102 could represent any suitable type of substrate, such as a silicon or other substrate. In particular embodiments, the substrate 102 may represent a silicon substrate that includes an n-type epitaxial layer with a p-type extension implant.

The integrated circuit 100 also includes various doped regions 104. The doped regions 104 represent areas of the substrate 102 that have been doped with one or more suitable materials. For example, when the substrate 102 represents a silicon substrate that includes an n-type epitaxial layer with a p-type extension implant, the doped regions 104 could represent areas of the substrate 102 that have been doped with one or more P+ dopants during a deep implantation process. Each of the doped regions 104 represents any suitable portion of the substrate 102 that has been doped with one or more suitable dopants. In particular embodiments, these doped regions 104 could form or represent clamp cells.

As shown here, the integrated circuit 100 further includes a trench MOS Schottky barrier ("TMBS") device formed by trenches 106 in the substrate 102. The trenches 106 in this example include an outer trench 108 and inner trenches 110 that join the outer trench 108. Portions 112 of the substrate 102 separate parts of the outer trench 108 from parts of the inner trenches 110 and the inner trenches 110 from each other. The portions 112 represent areas of the substrate 102 that were not etched to form the outer trench 108 and the inner trenches 110. In this TMBS device, the outer trench 108 may generally be a part of a clamp cell, while the inner trenches 110 implement the TMBS device using a Schottky diode structure.

In this example, four inner trenches 110 are shown as being formed within the outer trench 108, although any suitable number of inner trenches 110 could be used. Also, the outer trench 108, the inner trenches 110, and the portions 112 of the substrate 102 are each generally rectangular in shape. However, each of these elements could have any suitable shape and size. The trenches 106 could be formed in the substrate 102 in any suitable manner, such as by patterning a photoresist layer on the substrate 102, etching the substrate 102, and depositing appropriate material(s) in and over the etched substrate 102 to form the trenches 106. In particular embodiments, the portions 112 could be made as narrow as possible, subject only to manufacturing constraints (such as the resolution of the photolithography used to pattern and etch the substrate 102). Additional details regarding the formation of the trenches 106 are provided below.

In addition, a conductive layer 114 is formed over the trench MOS Schottky barrier device. In this example, the Schottky barrier is formed between the conductive layer 114 and the substrate 102. The conductive layer 114 is separated from the outer trench 108 by an insulating layer 116. The conductive layer 114 could be formed in any suitable manner using any suitable material(s), such as aluminum or polysilicon. Also, the insulating layer 116 could be formed in any suitable manner using any suitable material(s), such as an oxide.

In this integrated circuit 100, a trench MOS Schottky barrier device can be integrated into a standard integrated circuit process, such as a 1.5 μm bi-CMOS-DMOS (BCD) process. This allows the trench MOS Schottky barrier device to be integrated monolithically into an integrated circuit, which may help to reduce the cost of the integrated circuit (compared to multi-chip solutions). Monolithic integration may also help to reduce or avoid problems typically associated with multi-chip solutions, such as parasitic inductance. Monolithic integration may further permit the re-use of masking layers and other process steps, such as the masking layers used to fabricate trench VDMOS devices in the 1.5 μm BCD process. This may further reduce the cost of fabricating the trench MOS Schottky barrier device.

It may be noted that the outer trench 108 in FIG. 1A does not contact the surrounding doped regions 104, while the outer trench 108 in FIG. 1B does contact the surrounding doped regions 104. This is because FIG. 1A represents the device layout design (such as it is drawn on photomasks), while FIG. 1B may represent the integrated circuit 100 after further processing. The further processing could include thermal processing, which can cause lateral diffusion of the doped regions 104 (so the doped regions 104 in FIG. 1B come into contact with the outer trench 108). This further processing may also cause doped regions 104 to extend by some margin below the trenches 106.

Although FIGS. 1A and 1B illustrate one example of an integrated circuit 100 containing a trench MOS Schottky barrier device, various changes may be made to FIGS. 1A and 1B. For example, each component or element in FIGS. 1A and 1B could have any suitable size and shape and, if appropriate, any suitable electrical connections to other components of an integrated circuit. Also, each component or element in FIGS. 1A and 1B could be formed in any suitable manner using any suitable material(s).

Figure 2A:
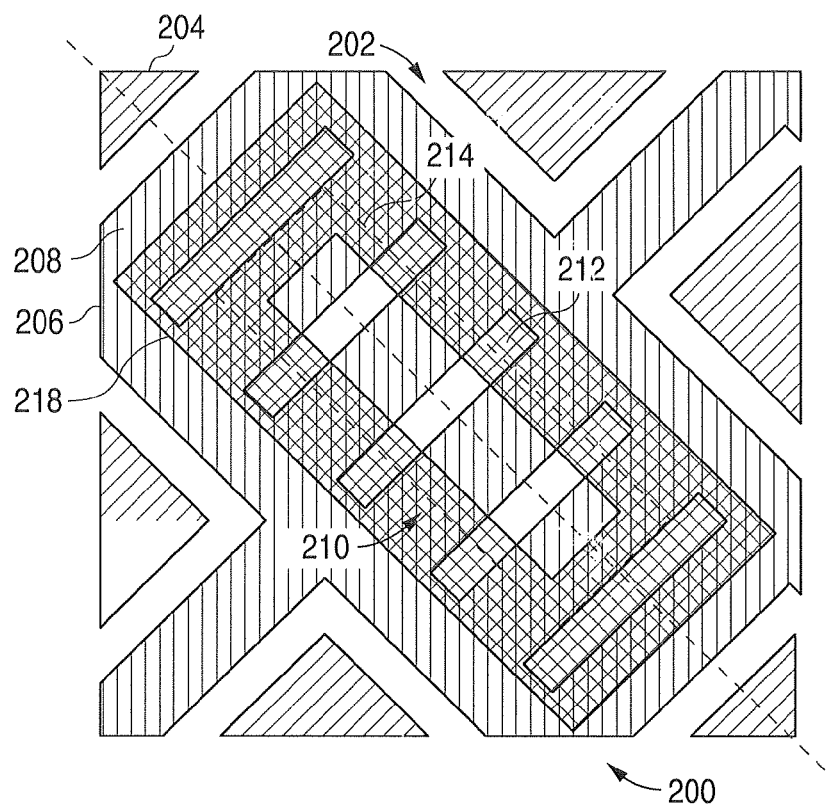
FIGS. 2A and 2B illustrate a second example integrated circuit containing a trench MOS Schottky barrier device according to this disclosure.
Figure 2B:
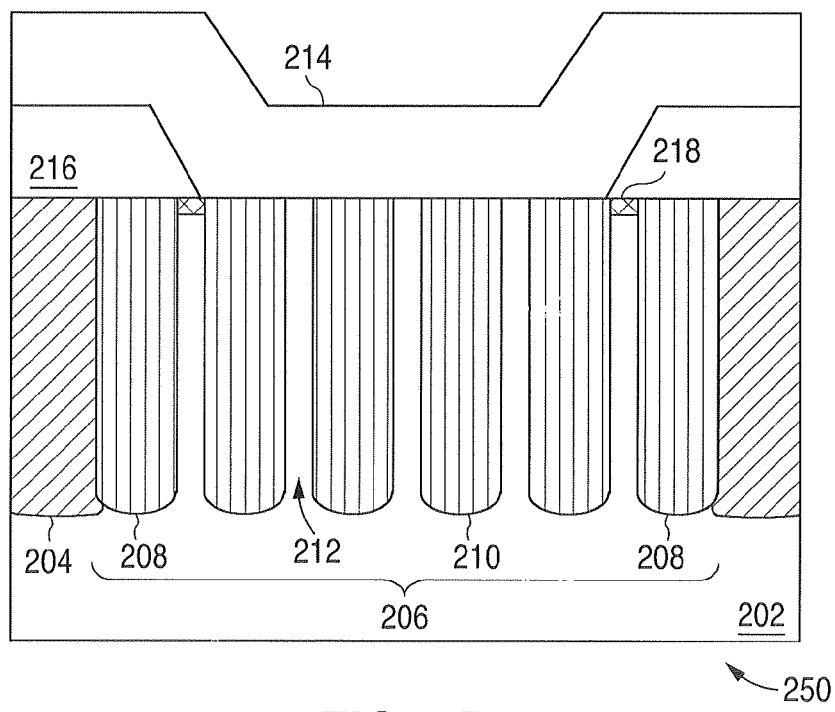

FIGS. 2A and 2B illustrate a second example integrated circuit containing a trench MOS Schottky barrier device according to this disclosure. The embodiment of the integrated circuit 200 shown in FIGS. 2A and 2B is for illustration only. Other embodiments of the integrated circuit 200 may be used without departing from the scope of this disclosure.

In this example, FIG. 2A represents a plan or layout view of the integrated circuit 200, and FIG. 2B represents a cross-section 250 of the integrated circuit 200 taken along the main dashed line in FIG. 2A. The integrated circuit 200 here is similar to the integrated circuit 100 shown in FIGS. 1A and 1B. For example, the integrated circuit 200 includes a substrate 202, doped regions 204, and a trench MOS Schottky barrier device formed using trenches 206 in the substrate 202. The trenches 206 in this example include an outer trench 208 and inner trenches 210 that join the outer trench 208. Portions 212 of the substrate 202 separate parts of the outer trench 208 from parts of the inner trenches 210 and the inner trenches 210 from each other. A conductive layer 214 and an insulating layer 216 are formed over the trench MOS Schottky barrier device.

In addition, the integrated circuit 200 includes a guard ring 218 around the inner trenches 210 of the trench MOS Schottky barrier device. The guard ring 218 is formed in the upper portion of the substrate 202, such as by doping the upper portion of the substrate 202. The guard ring 218 is also open over at least a portion of each of the inner trenches 210. Among other things, the guard ring 218 can be used to reduce off-state leakage current of the trench MOS Schottky barrier device. The guard ring 218 could have any suitable shape and be formed in any suitable manner, such as by performing a P+ implantation.

The integrated circuit 200 shown in FIGS. 2A and 2B may have many or all of the same benefits discussed above. For example, a trench MOS Schottky barrier device can be integrated into a standard integrated circuit process (such as a 1.5 μm BCD process), allowing monolithic integration into an integrated circuit. Monolithic integration may help to reduce the cost of the integrated circuit and may help to reduce or avoid problems such as parasitic inductance. Monolithic integration may also permit the re-use of masking layers and other process steps, such as the masking layers used to fabricate trench VDMOS devices in the 1.5 μm BCD process. In addition, enhancements (such as the guard ring 218 shown in FIGS. 2A and 2B) can be implemented in the integrated circuit 200 using existing BCD or other process steps. In conventional systems, this type of enhancement could require an additional masking step.

Although FIGS. 2A and 2B illustrate another example of an integrated circuit 200 containing a trench MOS Schottky barrier device, various changes may be made to FIGS. 2A and 2B. For example, each component or element in FIGS. 2A and 2B could have any suitable size and shape and, if appropriate, any suitable electrical connections to other components of an integrated circuit. Also, each component or element in FIGS. 2A and 2B could be formed in any suitable manner using any suitable material(s).

Figure 3A:
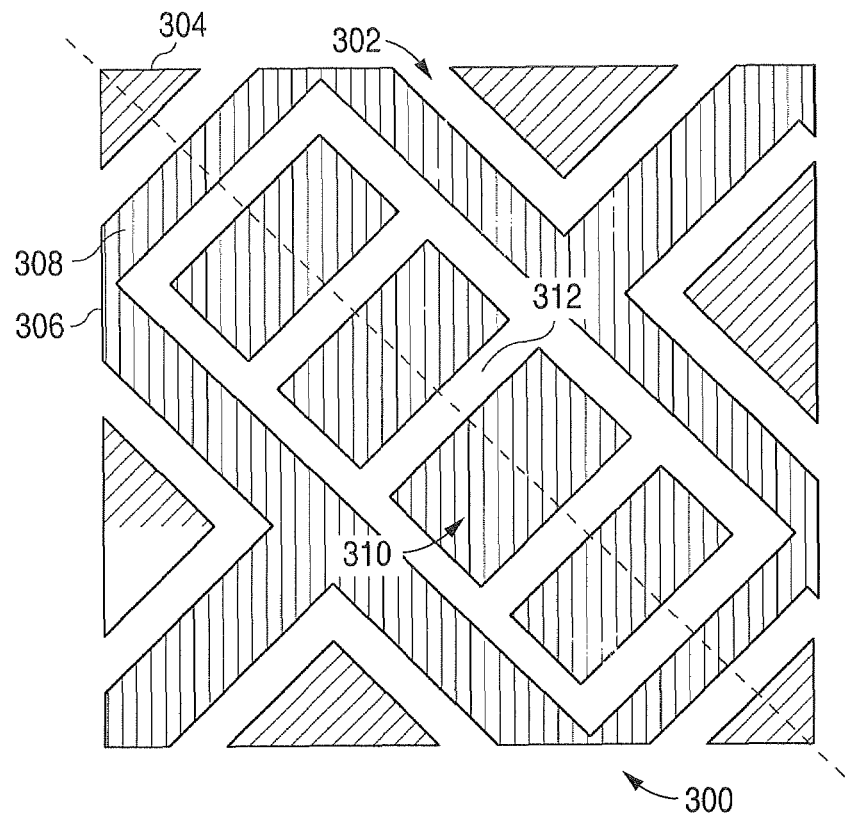
FIGS. 3A and 3B illustrate a third example integrated circuit containing a trench MOS Schottky barrier device according to this disclosure.
Figure 3B:
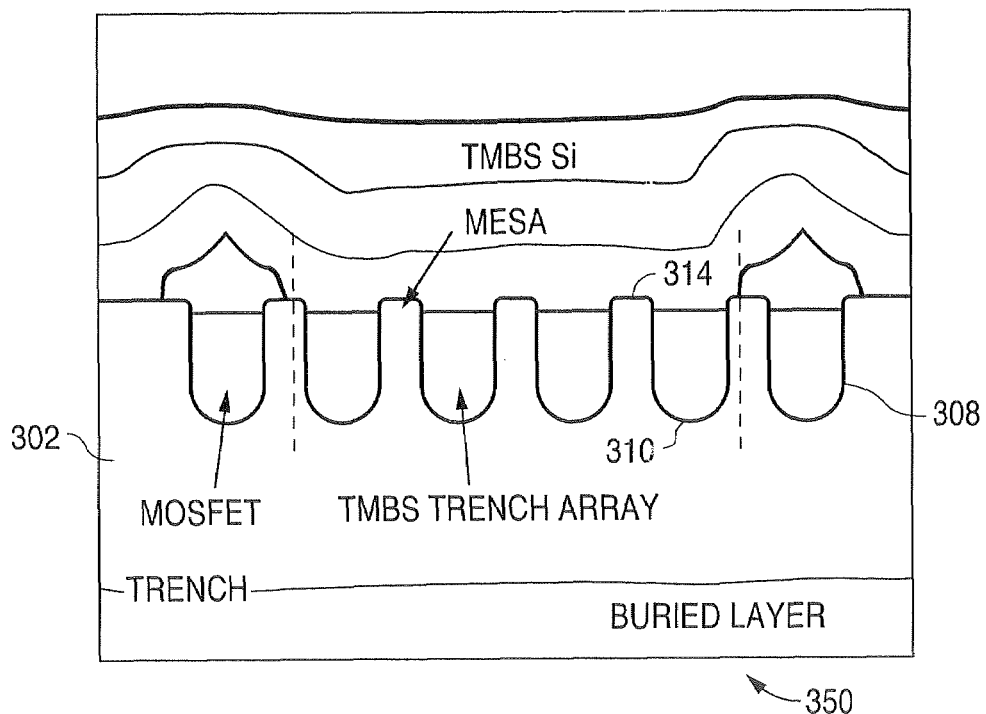

FIGS. 3A and 3B illustrate a third example integrated circuit 300 containing a trench MOS Schottky barrier device according to this disclosure. The embodiment of the integrated circuit 300 shown in FIGS. 3A and 3B is for illustration only. Other embodiments of the integrated circuit 300 may be used without departing from the scope of this disclosure.

In this example, FIG. 3A represents a plan or layout view of the integrated circuit 300, and FIG. 3B represents a cross-section 350 of the integrated circuit 300 taken along the main dashed line in FIG. 3A using electron microscopy. The integrated circuit 300 here is similar to the integrated circuits 100 and 200 described above. For example, the integrated circuit 300 includes a substrate 302, doped regions 304, and trenches 306 in the substrate 302.

In this example, the trenches 306 include an outer trench 308 and inner trenches 310 that do not join the outer trench 308. In this embodiment, the outer trench 308 could represent a MOS trench used with a MOS device, such as a trench VDMOS device. Also, the inner trenches 310 could represent the Schottky trenches used to form the trench MOS Schottky barrier device. In this layout, the outer trench 308 is electrically isolated from the inner trenches 310. For example, portions 312 of the substrate 302 are present between and separate each of the inner trenches 310 from the outer trench 308 and the inner trenches 310 from each other.

In FIG. 3B, the dashed lines represent the electrical isolation between a TMBS trench array (the inner trenches 310) and a MOSFET trench (the outer trench 308). Moreover, the trenches 308-310 are formed over a buried layer in the substrate 302. The buried layer represents a layer formed within the substrate 302. The buried layer can be formed from any suitable material(s), such as n-type silicon. The buried layer can also be formed in any suitable manner, such as by doping a layer of silicon at a suitable depth in the substrate 302 using ion implantation. In addition, as shown in FIG. 3B, the trenches 308-310 are separated by mesas 314, which in this example represent silicon mesas (portions of the substrate 302). These mesas 314 could have any suitable width, and the width could be determined or selected to provide desired leakage current and breakdown voltage characteristics of the TMBS device. As a particular example, each of the mesas 314 could have a width of approximately 0.5 μm. Although not shown, a guard ring could be incorporated into the integrated circuit 300 shown in FIGS. 3A and 3B.

In these embodiments, the diffusions in the substrate 302 may differ around the TMBS trench array (the inner trenches 310) and the MOSFET trench (the outer trench 308). For a MOSFET device formed using the outer trench 308, the substrate 302 could include n+ and/or p+ dopings and a p-type body. Details of one example MOSFET device (specifically a trench VDMOS device) and a technique for forming the MOSFET device are provided in U.S. Pat. No. 7,067,879, which is hereby incorporated by reference. For a TMBS device formed using the inner trenches 310, diffusions between the trenches 310 could represent a p-type extension implant only.

Although FIGS. 3A and 3B illustrate yet another example of an integrated circuit 300 containing a trench MOS Schottky barrier device, various changes may be made to FIGS. 3A and 3B. For example, each component or element in FIGS. 3A and 3B could have any suitable size and shape and, if appropriate, any suitable electrical connections to other components of an integrated circuit. Also, each component or element in FIGS. 3A and 3B could be formed in any suitable manner using any suitable material(s).

Figure 4:
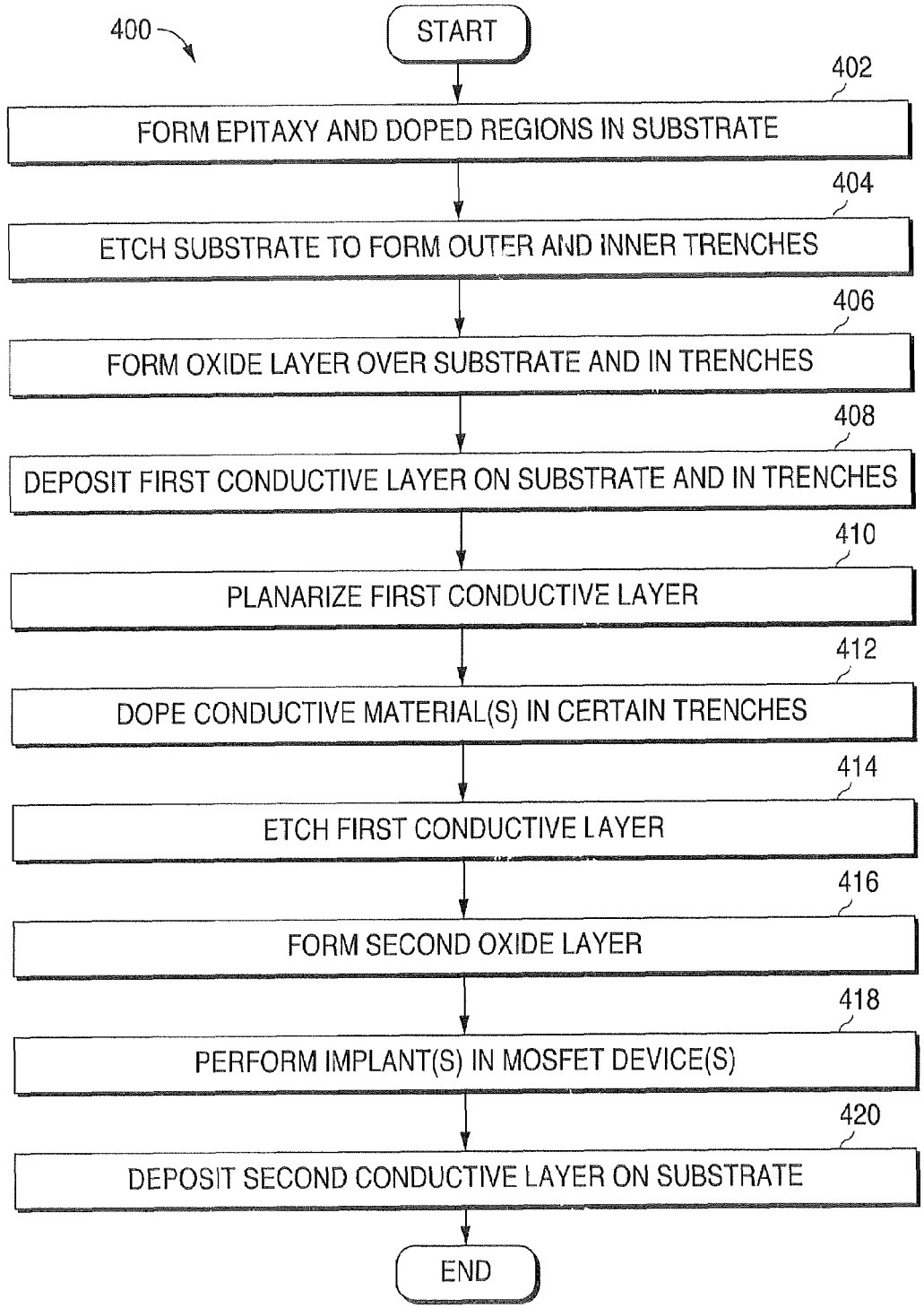
FIG. 4 illustrates an example method for forming an integrated circuit containing a trench MOS Schottky barrier device according to this disclosure.

FIG. 4 illustrates an example method 400 for forming an integrated circuit containing a trench MOS Schottky barrier device according to this disclosure. The embodiment of the method 400 shown in FIG. 4 is for illustration only. Other embodiments of the method 400 may be used without departing from the scope of this disclosure.

As shown in FIG. 4, an epitaxial layer and various doped regions are formed in a semiconductor substrate at step 402. This may include, for example, forming an n-type epitaxial layer in the substrate 102, 202, 302. The epitaxial layer can be formed using any suitable technique. This may also include performing the appropriate implantation(s) to form the doped regions 104, 204, 304, such as P+ doped regions. This may further include forming p-type extensions in the substrate. Each implantation could be performed in any suitable manner, such as by depositing a layer of photoresist, patterning the photoresist, and performing the appropriate implantation.

The substrate is etched to form trenches at step 404. This could include, for example, etching the substrate 102, 202, 302 to form the trenches 106, 206, 306. The trenches could include a larger outer trench 108, 208, 308 and multiple inner trenches 110, 210, 310 within the outer trench. The inner trenches may or may not contact the outer trench. Any suitable technique could be used to etch the substrate, such as by depositing a mask layer, patterning the mask, and performing an etch. As a particular example, a reactive ion etch (RIE) process could be used to form the trenches, such as an RIE process with an etch rate of 0.7 μm/minute and a mask selectivity of 40:1. Also, the mask layer could represent an oxide/nitride stack, such as one that can be used as a hard mask to etch trenches that are 2 μm in depth and 1 μm in width. The mask could then be removed, such as by using a wet etch.

At least one oxide layer is formed over the substrate and in the trenches at step 406. This could include, for example, oxidizing a portion of the substrate 102, 202, 302 to form a sacrificial oxide layer on the substrate and in the etched trenches 106, 206, 306. The sacrificial oxide layer could be formed in any suitable manner, such as by using a 600 Å dry thermal oxidation process. The sacrificial oxide layer can then be stripped to clean the sidewalls of each trench, such as by using a hydrogen fluoride (HF) dip process. This may also include forming a high-quality oxide layer on the substrate and in the etched trenches, such as by using a 300 Å dry thermal oxidation process.

A first layer of conductive material is deposited on the substrate and in the trenches at step 408. This could include, for example, depositing a polysilicon layer, such as by depositing a 15 kÅ layer of polysilicon or other material(s) using a low-pressure chemical vapor deposition (LPCVD) process. This may fill the trenches 106, 206, 306 formed in the substrate 102, 202, 302. The first conductive layer is then planarized at step 410. This may include, for example, performing an etch that may (among other things) reduce or eliminate recesses in the first conductive layer. This may also include partially oxidizing the first conductive layer, such as by using a high pressure oxidation (HiPOx) process followed by a wet etch-back process. This can be done to control the thickness of the first conductive layer, such as to a thickness of approximately 4 kÅ.

The conductive material in appropriate trenches is doped at step 412. This may include, for example, doping the polysilicon in the outer trench 108, 208, 308, which can be used to form one or more MOSFET devices. The doping can occur via any suitable process, such as implantation or diffusion.

The first conductive layer is then etched again at step 414. This may include, for example, using a photoresist mask and etching the first conductive layer. In this way, a thin conductive layer, such as a 4 kÅ polysilicide layer, may remain over part of the substrate to form a gate contact for the MOSFET device.

At least one second oxide layer is formed over the substrate at step 416. This may include, for example, removing the first oxide layer over the trenches 106, 206, 306, such as by using a timed etch-back process. The second oxide layer can then be formed over the substrate, such as by growing a 300 Å thick oxide layer over the substrate. The second oxide layer may be thicker over the trenches than in other areas.

One or more implants can then be performed at step 418. This could include, for example, implanting source regions within a p-body in the substrate. This can be done to complete the formation of the MOSFET device. Also, a second conductive layer can be deposited over the substrate at step 420, such as an additional layer of polysilicon. At this point, any additional structures can be formed over the substrate, such as by forming an insulating layer 116, 216 and/or conductive layer 114, 214 over the substrate.

In this way, a MOSFET device (such as a trench VDMOS device) and a TMBS device can be formed in the same integrated circuit. Moreover, the same general process steps can be used to form the MOSFET device and the TMBS device in an integrated circuit.

Although FIG. 4 illustrates one example of a method 400 for forming an integrated circuit containing a trench MOS Schottky barrier device, various changes may be made to FIG. 4. For example, while shown as a series of steps, various steps in FIG. 4 could overlap, occur in parallel, or occur in a different order.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
   forming a plurality of trenches in a semiconductor substrate, the plurality of trenches including an outer trench and a plurality of inner trenches within the outer trench;
   forming a metal-oxide semiconductor (MOS) device and a trench MOS Schottky barrier (TMBS) device in the semiconductor substrate using the plurality of trenches; and
   forming a guard ring that covers portions of the inner trenches, the guard ring open over other portions of the inner trenches.

2. The method of claim 1, wherein at least one of the inner trenches contacts the outer trench.

3. The method of claim 1, wherein at least one of the inner trenches is electrically isolated from the outer trench.

4. The method of claim 1, wherein:
   the outer trench forms a ring around the inner trenches;
   each of the inner trenches is rectangular; and
   portions of the substrate separate each of the inner trenches from the outer trench and each of the inner trenches from the other inner trenches.

5. The method of claim 4, wherein:
   the substrate between the inner trenches comprises a p-type extension implant formed in an s-type epitaxial layer; and
   the substrate around the outer trench comprises at least one n+ or p+ doped region in a p-type body in the substrate.

6. The method of claim 1, further comprising:
   forming a plurality of deep doped regions in the substrate, the deep doped regions around the trenches.

7. The method of claim 1, wherein:
   the MOS device comprises a trench vertical double-diffused metal-oxide semiconductor (VDMOS) device; and
   the TMBS device is monolithically integrated with the trench VDMOS device.

8. The method of claim 1, wherein the guard ring is formed by performing a p+ implantation.

9. An integrated circuit comprising:
   a semiconductor substrate;
   a metal-oxide semiconductor (MOS) device monolithically integrated with a trench MOS Schottky barrier (TMBS) device, the MOS device and the TMBS device comprising a plurality of trenches in the semiconductor substrate, the plurality of trenches including an outer trench and a plurality of inner trenches within the outer trench; and
   a guard ring covering portions of the inner trenches, the guard ring open over other portions of the inner trenches.

10. The integrated circuit of claim 9, wherein at least one of the inner trenches contacts the outer trench.

11. The integrated circuit of claim 9, wherein at least one of the inner trenches is electrically isolated from the outer trench.

12. The integrated circuit of claim 9, wherein:
    the outer trench forms a ring around the inner trenches;
    each of the inner trenches is rectangular; and
    portions of the substrate separate each of the inner trenches from the outer trench and each of the inner trenches from the other inner trenches.

13. The integrated circuit of claim 12, wherein:
    the substrate between the inner trenches comprises a p-type extension implant formed in an n-type epitaxial layer; and
    the substrate around the outer trench comprises at least one n+ or p+ doped region in a p-type body in the substrate.

14. The integrated circuit of claim 9, wherein the substrate comprises a plurality of deep doped regions around the trenches.

15. The integrated circuit of claim 9, wherein:
    the MOS device comprises a trench vertical double-diffused metal-oxide semiconductor (VDMOS) device; and
    the TMBS device is monolithically integrated with the trench VDMOS device.

16. The integrated circuit of claim 9, wherein the guard ring comprises a p+ dopant.

17. An integrated circuit comprising:
    a semiconductor substrate;
    a vertical double-diffused metal-oxide semiconductor (VDMOS) device formed in a portion of the substrate, the VDMOS device comprising an outer trench ring in the substrate; and
    a trench MOS Schottky barrier (TMBS) device formed in another portion of the substrate, the TMBS device comprising a plurality of inner trenches surrounded by the outer trench ring in the substrate, the inner trenches electrically isolated from the outer trench ring.

18. The integrated circuit of claim 17, wherein:
    the outer trench ring is rectangular;
    each of the inner trenches is rectangular; and
    portions of the substrate separate each of the inner trenches from the outer trench ring and each of the inner trenches from the other inner trenches.

19. The integrated circuit of claim 18, wherein:
    the substrate between the inner trenches comprises a p-type extension implant formed in an n-type epitaxial layer; and
    the substrate around the outer trench ring comprises at least one n+ or p+ doped region in a p-type body in the substrate.

20. The integrated circuit of claim 17, further comprising a guard ring that covers portions of the inner trenches, the guard ring open over other portions of the inner trenches.

* * * * *

UNITED STATES PATENT AND TRADEMARK OFFICE
CERTIFICATE OF CORRECTION

| | | |
|---|---|---|
| PATENT NO. | : 7,741,693 B1 | Page 1 of 1 |
| APPLICATION NO. | : 11/985628 | |
| DATED | : June 22, 2010 | |
| INVENTOR(S) | : Terry Dyer | |

It is certified that error appears in the above-identified patent and that said Letters Patent is hereby corrected as shown below:

Column 7, claim 5, line 47, delete "s-type" and replace with --n-type--.

Signed and Sealed this
Twelfth Day of April, 2011

David J. Kappos
*Director of the United States Patent and Trademark Office*